United States Patent [19]
Chatelon et al.

[11] 3,739,375
[45] June 12, 1973

[54] AUXILIARY CIRCUIT FOR ANALOG TO DIGITAL CODER

[75] Inventors: André Edouard Joseph Chatelon, Montrouge; Marc Andre Regniér, Aulnay-sous-Bois, both of France

[73] Assignee: International Standard Electric Corporation, New York, N.Y.

[22] Filed: Apr. 10, 1969

[21] Appl. No.: 815,016

[30] Foreign Application Priority Data

Apr. 24, 1968 France ............................ 68149222

[52] U.S. Cl. ..................... 340/347 CC, 340/347 AD
[51] Int. Cl. ........................................... H03k 13/02
[58] Field of Search ..................... 328/151; 330/51, 330/69; 307/238; 340/347, 347 AD, 347 SH, 347 CC; 235/154

[56] References Cited

UNITED STATES PATENTS

| | | | |
|---|---|---|---|
| 3,366,948 | 1/1968 | Price | 340/347 CC |
| 3,581,305 | 5/1971 | Howlette | 340/347 AD |
| 3,158,759 | 11/1964 | Jasper | 340/347 X |
| 3,164,826 | 1/1965 | McGrogen, Jr. | 340/347 |
| 3,384,889 | 5/1968 | Lucas | 340/347 |

*Primary Examiner*—Maynard R. Wilbur
*Assistant Examiner*—Jeremiah Glassman
*Attorney*—C. Cornell Remsen, Jr., Walter J. Baum, Percy P. Lantzy, J. Warren Whitesel, Delbert P. Warner and James B. Raden

[57] ABSTRACT

A high-gain differential amplifier is used as a comparator in a PCM coder. The amplifier may oscillate during the time reserved for the charge of the holding capacitor. According to the invention an auxiliary circuit delivers, during that time, a voltage which is higher than the maximum possible value of the signal to be coded. This high voltage is applied to the comparator in order to block it.

5 Claims, 1 Drawing Figure

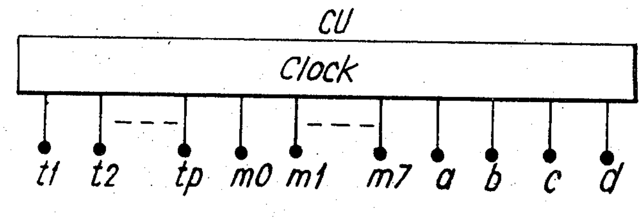
CU
Clock
t1 t2 tp m0 m1 m7 a b c d
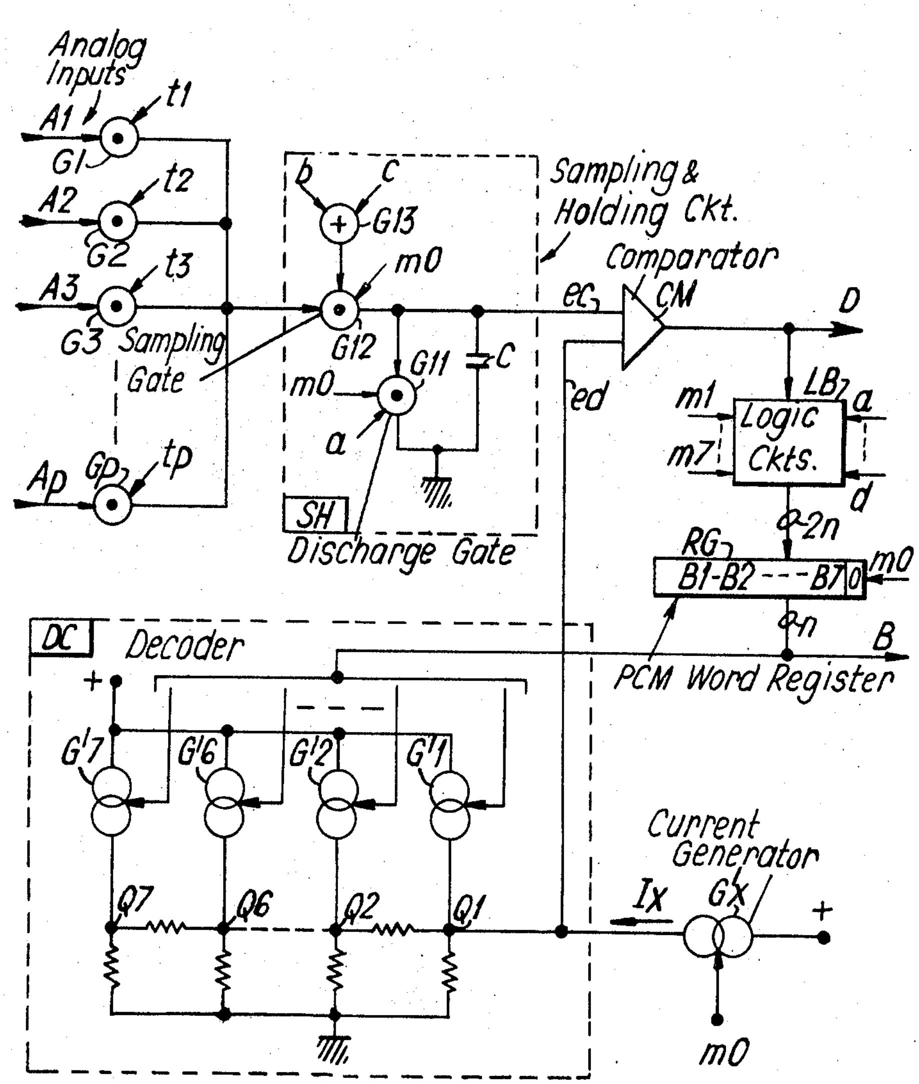
Analog Inputs
A1
A2
A3
Ap
G1
G2
G3
Gp
t1
t2
t3
tp
Sampling Gate
b
c
G13
m0
G12
G11
C
a
SH
Discharge Gate
Sampling & Holding Ckt.
Comparator
ec
CM
ed
D
LB
m1
m7
Logic Ckts.
a
d
2n
RG
B1-B2---B7
0
m0
n
B
PCM Word Register
DC
Decoder
+
G'7
G'6
G'2
G'1
Q7
Q6
Q2
Q1
Current Generator
Ix
Gx
+
m0

AUXILIARY CIRCUIT FOR ANALOG TO DIGITAL CODER

The present invention relates to an auxiliary circuit for analog to digital coders and more particularly to means for blocking a comparator in a pulse code modulation system during the time while a charge is on a holding capacitor.

In a coder of the described type, the analog input signals are generally sampled at a given frequency. Each sample is then stored in a holding capacitor. This operation is carried out between two coding operations, and afterward the sampled signal is applied to one input of a comparator which receives a reference analog signal on a second input terminal. In a feedback coder, this signal is obtained by coding a number stored in a register by successive approximations. The value of the encoded number is increased or decreased by modifying one digit at a time according to the result of the comparison until a parity is indicated by the comparator. At the end of the coding, the holding capacitor is discharged and the register is cleared. Then, the next sample is stored on the capacitor.

Thus, it is seen that both inputs of the comparator are grounded during a short time interval. It is also observed that, when there is a high gain, oscillations may take place which are transmitted by the stray couplings (for instance the supply source), to disturb the charge on the holding capacitor. Therefore, an error appears in the value of the sample. This error becomes more important as the level of the sample voltage becomes smaller.

To overcome this drawback, the present invention applies a control voltage to block the comparator, regardless of the amplitude of the sample, during the time reserved for these operations. This blocking is carried out by applying a voltage at the input of the comparator which receives the decoded voltage. The applied voltage has an amplitude which is higher than the maximum possible value of the voltage which is to be coded.

When the decoder is constituted by a ladder attenuator supplied by current generators such as in French Pat. Nos. 1,357,668 and 1,460,676, this applied voltage is obtained by injecting a current of suitable value into the attenuator.

Accordingly, an object of the present invention is to avoid the amplitude errors in a coder which are due to the instability of the comparator.

The invention is characterized by the fact that, during the time reserved for the discharge of the holding capacitor, before it is charged by a new sample, and during the clearing of the register in which the number characterizing the preceding sample is stored, a voltage is applied to the comparator which has an amplitude that is higher than the maximum amplitude which the voltage to be coded can reach. This high amplitude voltage blocks the comparator during this time.

The above mentioned and other features and objects of this invention will become apparent by reference to the following description taken in conjunction with the accompanying single sheet of drawings which represents the diagram of a feedback coder.

An auxiliary circuit, according to the invention, will be described as an example in its application to a time multiplex coder associated to a transmission system which presents the following characteristics:

Number of channels: $p$ channels are defined by the channel time slots $t1$, $t2$ ... $tp$ of unit duration $t$;

Number of digit time slots: each channel time slot has a duration $t$ and is divided into eight, equal duration, digit time slots $m$0, $m$1, $m$2 ... $m$7. The times $m$1 to $m$7 are reserved for the coding into a seven digit number. The time slot $m$0 is a guard time used, in the coder, for the operations which are carried out between the coding of two successive samples;

Number of basic time slots: each digit time slot is divided into four basic time slots $a$, $b$, $c$, $d$ of equal duration.

The figure represents the simplified diagram of the coder which comprises:

A clock CU for delivering the signals defined hereabove.

A multiplexing circuit comprises the AND gates G1, G2 ... Gp which receive the analog signals A1, A2 ... Ap of the $p$ channels. These gates are activated in time succession by the signals $t1$, $t2$ ... $tp$.

The sampling and holding circuit SH which comprises the memory capacitor C, the discharge gate G11 and the sampling gate G12.

At the basic time slot $a$ of the guard time $m$0, the gate G11 short-circuits the capacitor C which discharges completely. At the following times $b$ and $c$, the AND GATE G12 is activated under the control of the signal supplied by the OR gate G13, and the capacitor C is charged to the value ec of the voltage delivered by the multiplexing circuit.

The register RG comprising $n$=7 flip-flops B1 to B7 (B1 is the most significant flip-flop which is cleared at time $m$0).

The decoder DC which delivers a voltage ed characterizing the value of the number stored in the register RG.

This is a linear decoder of the same type as those described in the above cited French Patents. It comprises, first, a ladder attenuator of characteristic impedance Z having seven injection points Q1 to Q7, and second, the current generators G'1 to G'7. If each cell of the attenuator presents an attenuation of "2" and if all the generators deliver the same current I, there is a linear decoding by triggering G'7 when the flip-flop B1 of the register is in the 1 state, by triggering G'6 when B2 is in the 1 state, etc...

The comparator CM is a high gain differential amplifier (G=1 500) which receives the voltages ec and ed at its inputs.

Owing to this high value of the gain, the output voltage of this comparator can only present two distinct values, as a practical matter. Therefore the PCM code words appear in series form at the output D. Also, the codes are available in parallel form at the end of each channel time at the output B.

The logic circuits LB receive first, the output signal of the comparator CM, and second, the digit time slot and the basic time slot signals. This block comprises 2$n$ outputs connected to the 0 and 1 inputs of the n flip-flops of the register RG. The function of this logical block LB consists in controlling, in time $m$1, the setting into the 1 state of the flip-flop B1 of the register RG. Then, logic block LB sets it to the 0 state if the comparator has delivered an information characterizing the fact that ed $<$ ed. In time m2, it is the flip-flop B2 which is set to the 1 state, then reset to 0 if ec $<$ ed, etc...

The current generator Gx is triggered by the signal m0. This generator is put into operation during the time reserved for the discharge of the capacitor C to its residual charge level, and for the clearing of the register RG.

At this time m0, the comparator CM receives zero voltages on its two inputs. Thus, it may oscillate giving rise to an error in the amplitude of the voltage stored in the capacitor C. In order to avoid this oscillation, the generator Gx is triggered during the time m0, If, for instance, the amplitude of the signals ec may vary between the values 0 and + Ec, the amplitude of the current Ix supplied by the generator Gx is such that the voltage ed=Z.Ix is higher than Ec. Therefore, whatever may be the value of the charge on the condenser C during the time m0, the comparator receives a high voltage on its input connected to the decoder DC, so that it cannot either change its state, or oscillate.

If the auxiliary circuit just described is used in a symmetrical coder in which the amplitude of the signals to be coded varies between − Ec and + Ec, the amplitude of the voltage supplied by the decoder at the time mo must be higher than | Ec |, and that can be either positive or negative.

While the principles of the above invention have been described in connection with specific embodiments and particular modifications thereof, it is to be clearly understood that this description is made by way of example and not as a limitation of the scope of the invention.

We claim:

1. An auxiliary circuit for analog to digital coders comprising:

first means for sampling analog signals at predetermined periodic intervals and for storing samples derived from said signals on a capacitor;

second means responsive to a sample having been stored for generating a PCM word having n digits, where *n* is an integer greater than one;

third means coupled to said second means to decode said generated PCM word, said third means including

*n* current generators, each of said generators being controlled by a different one of said *n* digits of said generated PCM word, and a ladder attenuator appropriately coupled to said *n* current generators to produce an output voltage proportional to said generated PCM word;

said second means including comparator means having one input thereof coupled to said capacitor and the other input thereof coupled to said ladder attenuator to generate said PCM word by comparing the amplitude of said stored samples with said output voltage; and a current generator coupled to said ladder attenuator to produce, in the intervals between sampling, a blocking voltage having a magnitude higher than the maximum possible magnitude of said signals to be coded, said blocking voltage being coupled to said other input of said comparator means to prevent oscillations of said comparator means.

2. A circuit according to claim 1, further including a register having *n* stages to store a different one of said *n* digits of said generated PCM word; and logic circuit means coupled to the output of said comparator to couple said *n* digits of said generated PCM word to the appropriate one of said *n* stages of said register.

3. A circuit according to claim 2, wherein said comparator means includes a higher gain differential amplifier having one input thereof coupled to said capacitor to receive said stored samples and the other input thereof coupled to said ladder attenuator to receive said output voltage and said blocking voltage.

4. A circuit according to claim 3, wherein said register is cleared and said capacitor is discharged when said blocking voltage is produced.

5. A circuit according to claim 1, wherein said comparator means includes a high gain differential amplifier having one input thereof coupled to said capacitor to receive said stored samples and the other input thereof coupled to said ladder attenuator to receive said output voltage and said blocking voltage.

* * * * *